US012100132B2

(12) United States Patent
Lauber et al.

(10) Patent No.: US 12,100,132 B2
(45) Date of Patent: Sep. 24, 2024

(54) LASER ANNEAL PATTERN SUPPRESSION (71) Applicant: KLA CORPORATION, Milpitas, CA (US)

(72) Inventors: Jan Lauber, San Francisco, CA (US); Jason Kirkwood, Mountain View, CA (US)

(73) Assignee: KLA CORPORATION, Milpitas, CA (US)

( * ) Notice: Subject to any disclaimer, the term of this patent is extended or adjusted under 35 U.S.C. 154(b) by 335 days.

(21) Appl. No.: 17/504,475

(22) Filed: Oct. 18, 2021

(65) Prior Publication Data
US 2023/0122514 A1 Apr. 20, 2023

(51) Int. Cl.
*G06T 7/12* (2017.01)
*G01N 21/95* (2006.01)
*G06T 5/20* (2006.01)
*G06T 5/40* (2006.01)
*G06T 7/00* (2017.01)
*G06T 7/13* (2017.01)
*G06T 7/90* (2017.01)

(52) U.S. Cl.
CPC ....... *G06T 7/0006* (2013.01); *G01N 21/9501* (2013.01); *G06T 5/20* (2013.01); *G06T 5/40* (2013.01); *G06T 7/12* (2017.01); *G06T 7/13* (2017.01); *G06T 7/90* (2017.01); *G06T 2207/20021* (2013.01); *G06T 2207/30148* (2013.01)

(58) Field of Classification Search
CPC .................................................. G06T 7/0006
See application file for complete search history.

(56) References Cited

U.S. PATENT DOCUMENTS

| 5,318,676 A | * | 6/1994 | Sailor | C25F 3/12 |
| | | | | 205/676 |
| 11,199,508 B1 | * | 12/2021 | Wu | G01N 21/9501 |
| 2002/0042153 A1 | * | 4/2002 | Holcman | H01L 22/34 |
| | | | | 438/462 |
| 2011/0033131 A1 | | 2/2011 | Tse et al. | |
| 2011/0280470 A1 | | 11/2011 | Hayashi | |
| 2014/0234994 A1 | * | 8/2014 | Abe | G01N 21/6489 |
| | | | | 250/459.1 |
| 2014/0320627 A1 | * | 10/2014 | Miyamoto | G01N 23/00 |
| | | | | 348/80 |
| 2018/0335396 A1 | | 11/2018 | Nagano | |
| 2019/0287837 A1 | * | 9/2019 | Ichinose | G01B 11/272 |
| 2020/0043815 A1 | * | 2/2020 | Lee | G06T 7/0006 |
| 2021/0271122 A1 | | 9/2021 | He | |

FOREIGN PATENT DOCUMENTS

KR 20040110588 A 12/2004

OTHER PUBLICATIONS

WIPO, International Search Report for International Application No. PCT/US2022/046349, Feb. 8, 2023.
WIPO, Written Opinion of the International Searching Authority for International Application No. PCT/US2022/046349, Feb. 8, 2023.

* cited by examiner

*Primary Examiner* — Oneal R Mistry
(74) *Attorney, Agent, or Firm* — Hodgson Russ LLP (57) ABSTRACT

A location of grid lines in an image of a laser-annealed semiconductor wafer is determined. An area covered by the grid lines can be filled using a new gray value. The new gray value can be based on a second gray scale value of a neighborhood around the area. The neighborhood is outside of the area covered by the grid lines.

16 Claims, 6 Drawing Sheets

LASER ANNEAL PATTERN SUPPRESSION

FIELD OF THE DISCLOSURE

This disclosure relates to processing semiconductor wafer images.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

The laser annealing process generates a strong grid pattern on the backside of the wafer, which appears as discoloration of the region illuminated and heated by the laser. The grid pattern can appear as brighter than the rest of the wafer or can appear darker than the rest of the wafer. Since a backside illumination tool inspects the bare region, these grid patterns can be labeled or classified as false defects. To avoid this error, inspection algorithms are tuned down or the grid pattern is blacked out. These techniques can avoid being overwhelmed by false defects.

Figure 1:
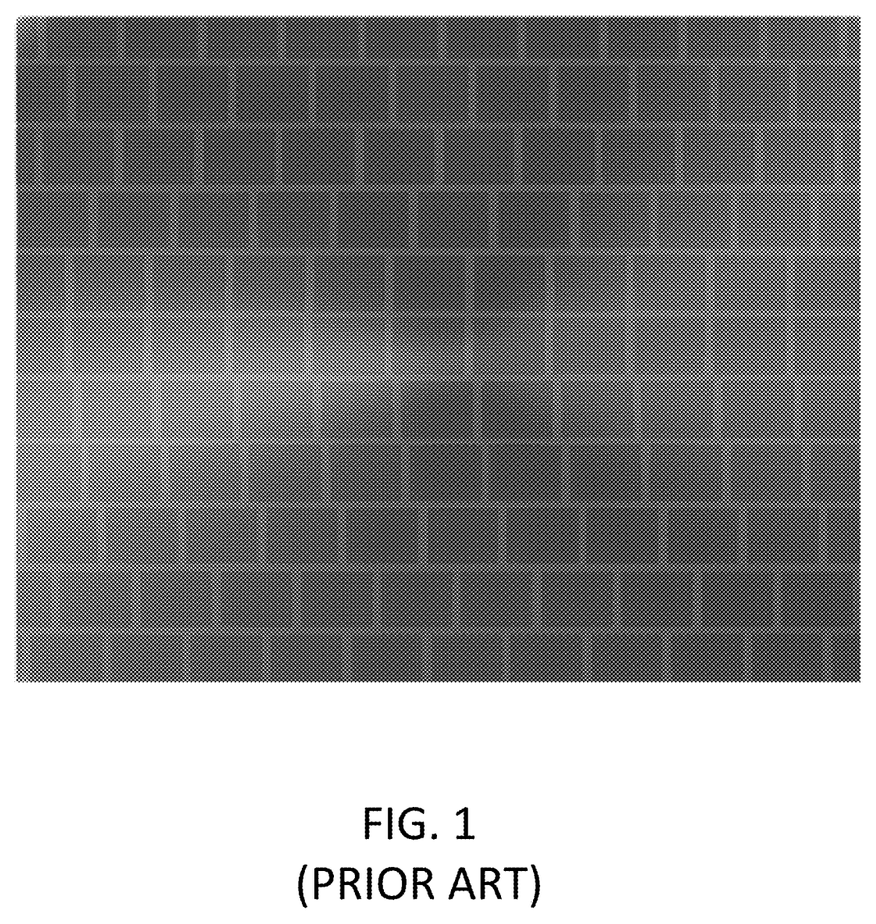
FIG. 1 is a backside wafer image with visible laser anneal grid patterns.

The detuning of the defect detection algorithm results in a loss of sensitivity, which can lead to damaged chips passing the quality control step. Blacking out the grid lines leads to loss of defects that fall on or near the laser anneal gridlines. FIG. 1 shows a backside wafer image after the laser annealing process has been applied. The regular grid lines are visible. Defects can occur on or near these grid lines. Some of these defects can coincide with the grid patterns. The intensity of some of these defects are of similar magnitude as the gridlines themselves, which makes it difficult to detect the defects. Defects that are close to or on top of the grid lines will be lost to subsequent defect detection algorithms if the grid lines are blacked out.

Therefore, improved systems and techniques are needed.

BRIEF SUMMARY OF THE DISCLOSURE

A system is provided in a first embodiment. The system includes a light source that generates light; a stage configured to hold a laser-annealed semiconductor wafer in a path of the light; a detector configured to receive the light reflected from the laser-annealed semiconductor wafer; and a processor in electronic communication with the detector. The processor is configured to generate an image of the laser-annealed semiconductor wafer using data from the detector; determine a location of grid lines in the image; and fill an area covered by the grid lines using a new gray value based on a second gray scale value of a neighborhood around the area. The neighborhood is outside of the area covered by the grid lines.

The processor can be further configured to: compare a first gray scale value of the area covered by the grid lines to the second gray scale value of the neighborhood around the area; and divide the first gray scale value in the area by a correction ratio to determine the new gray value. The correction ratio is an average gray level in the area divided by an average gray level in the neighborhood. The second gray scale value can be taken from a position farther than a width of the grid line from the first gray scale value. The comparing, the dividing, and the filling can be repeated for all pixels in the grid lines of the image.

The light source and the detector can be configured such that the image is a bright field image or a dark field image.

The processor can be further configured to perform defect inspection on the image after the area is filled with the new gray value.

The determining can use Sobel edge detection.

The filling can include histogram remapping.

A method is provided in a second embodiment. A location of grid lines in an image of a laser-annealed semiconductor wafer is determined using a processor. Using the processor, an area covered by the grid lines is filled using a new gray value based on a second gray scale value of a neighborhood around the area. The neighborhood is outside of the area covered by the grid lines.

The method can further include: comparing, using the processor, a first gray scale value of the area covered by the grid lines to the second gray scale value of the neighborhood around the area; and dividing, using the processor, the first gray scale value in the area by a correction ratio to determine the new gray value. The correction ratio is an average gray level in the area divided by an average gray level in the neighborhood. The second gray scale value can be taken from a position farther than a width of the grid line from the first gray scale value. The comparing, the dividing, and the filling can be repeated for all pixels in the grid lines of the image.

The image can be a bright field image or a dark field image.

The method can further include performing defect inspection on the image after the filling.

The determining can use Sobel edge detection.

The filling can include histogram remapping.

A non-transitory computer readable medium storing a program configured to instruct a processor to execute the method of the second embodiment.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 2:
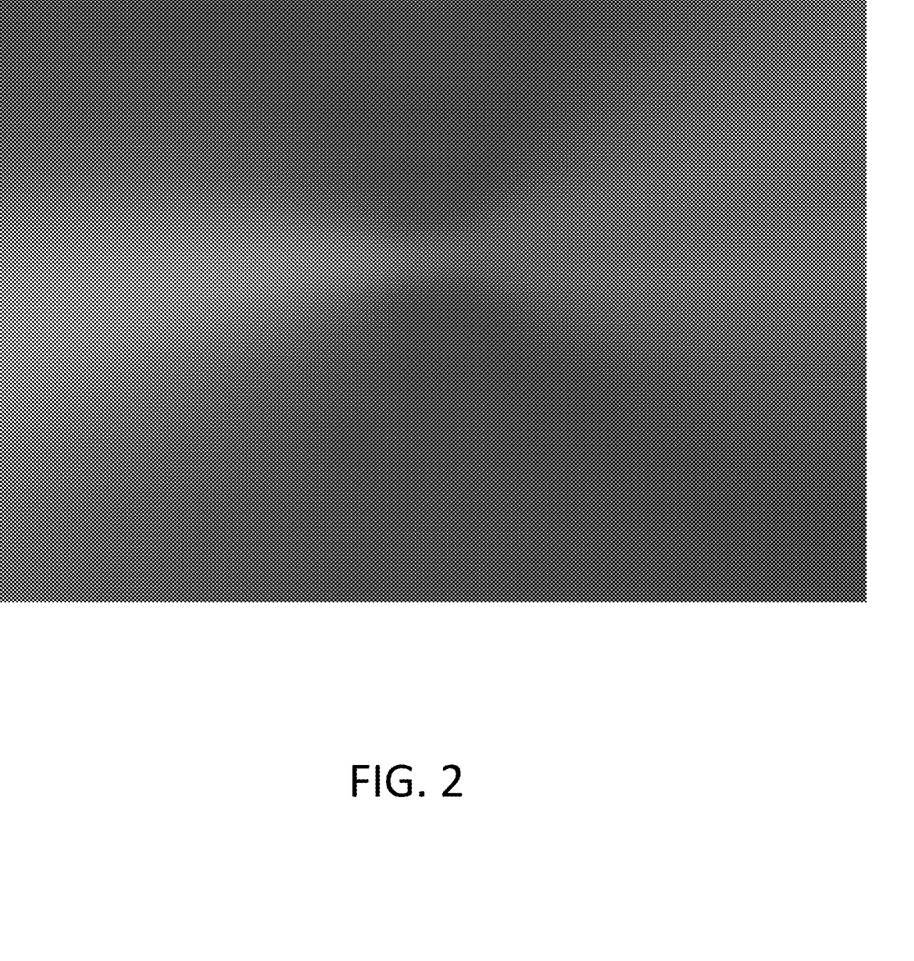
FIG. 2 is the image of FIG. 1 with the grid pattern suppressed using embodiments disclosed herein.

Embodiments disclosed herein correct and suppress brightness variations of regions of discoloration on a laser-annealed semiconductor wafer. The subsequent defect detection algorithm may no longer find false defects from this grid pattern, which means the defect detection algorithm can maintain full sensitivity. For example, FIG. 2 is the image of FIG. 1 after the grid pattern is suppressed using the embodiments disclosed herein. The grid pattern is no longer visible in FIG. 2.

Figure 3:
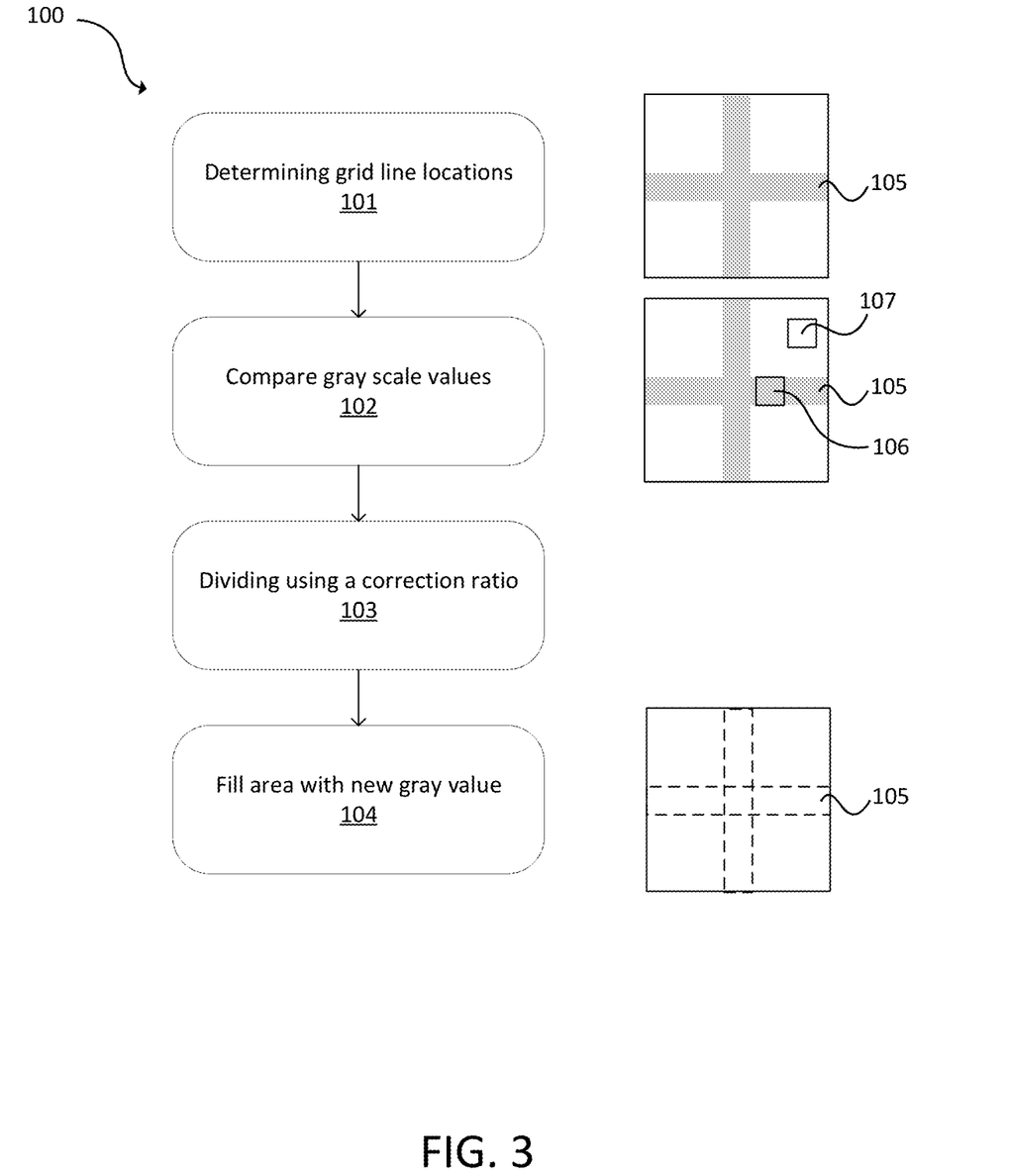
FIG. 3 is a flowchart of an embodiment in accordance with the present disclosure.

An embodiment of the method 100 is shown in FIG. 3 with a corresponding schematic to the right of each step. Some or all the steps of FIG. 3 can be performed using a processor. While a single image is disclosed, the method 100 can be performed on multiple images of a semiconductor wafer or across multiple semiconductor wafers.

At 101, the location of grid lines 105 in an image of a laser-annealed semiconductor wafer are determined. The grid lines 105 are a darker shade (e.g., of gray) than the non-grid lines in the exemplary image, but also can be a brighter shade than the non-grid lines.

The image can be a bright field or a dark field image. The grid lines may be light or dark depending on whether the image is a bright field or dark field image.

The location of the grid lines can vary from wafer to wafer. Furthermore, the grid lines may not be lined up with the wafer orientation. Thus, the grid lines can show up at an angle. Measuring and correcting this relative angle can allow the grid location to be determined more accurately. In an instance, the exact location of grid lines can be determined by making use of the regular spacing between the gridlines.

Several other techniques can be used to determine a location of the grid lines. For example, the grid line location can be determined using Sobel edge detection or Canny filters.

In another instance, the grid line location can be determined in frequency space using Fourier transforms. Fourier analysis examines the image in terms of frequencies. Any regularly-spaced pattern can appear as a strong peak in the frequency spectrum.

In yet another instance, the grid line location can be determined using the regularly repeating grid patterns. The intended placement of the grid lines relative to a starting point in the design can be used. Other techniques than those listed herein can be used to determine a location of the grid lines.

After the grid line locations are determined at 101, an area covered by the grid lines 105 is filled using a new gray value based on a second gray scale value of a neighborhood 107 around the area 106. The neighborhood 107 is outside of the area 106, which is covered by the grid lines 105.

At 102, a first gray scale value of an area 106 covered by the grid lines 105 is compared to a second gray scale value of a neighborhood 107 around the area 106. The neighborhood can be on either side of the grid line 105 or can take an average of values on both sides of the grid line 105. The second gray value can be taken from a position that is a distance from the grid line larger than a width of the grid line, which can prevent the second gray value from being too similar to the first gray scale value. In an instance, the second gray scale value is within 64 pixels of the first gray scale value.

Choosing the neighborhood 107 to be as close to the grid line 105 as practicable can provide a more accurate measure of the correction value than if the neighborhood 107 is chosen to be farther away. The exact distance can vary for different examples and can be selected by the user to optimize the result.

A correction amount is determined at 103. For example, the first gray scale value in the area 106 is divided by a correction ratio. Dividing the first gray scale value can determine a new gray value. The correction ratio is an average gray level in the area 106 divided by an average gray level in the neighborhood 107.

The average gray level can be determined as an average of gray levels in a box or in horizontal/vertical lines. The area can depend on if horizontal/vertical grid lines are being corrected or if a different area is being corrected. The size of the box or line can be selected by the user to optimize the correction result.

In another embodiment, the correction amount is determined with an additive term. The correction amount of gray levels can be added to or subtracted from the original value instead of using the correction ratio.

The area 106 is filled with the new gray value at 104. Thus, the pixels on the gridlines can be corrected to look more closely like their non-grid neighbors. FIG. 2 shows the same wafer image as in FIG. 1 after such a gray level correction. Gridlines are now nearly invisible to the naked eye. Defects on or near the gridlines can be visible with increased signal-to-noise ratio.

The area 106 can be filled on a pixel-by-pixel or area-by-area basis. The area 106 can be filled within boundaries determined during step 101. Thus, application to an area 106 that includes multiple pixels, a single pixel, or a line is possible.

Since the gray scale can vary significantly over the wafer, depending on the processes that have been applied to the wafer backside, the gray scale variations can be measured and corrected locally. Gray scale measurements on and off the gridlines can be achieved with several different techniques to measure average gray level in 1-D (linear projections) or 2-D.

For example, histogram remapping can be performed to fill the area 106. The gray level distributions in the area 106 and neighborhood 107 can be compared and the endpoints of the histograms can be matched to each other to find the corrected distribution. Other color correction schemes also can be applied.

The comparing 102, the correction amount determination 103, and the filling 104 can be repeated for all pixels in the grid lines of the image. This can be performed pixel-by-pixel or can be performed using multiple local regions within the gridlines.

Defect inspection can be performed on the image after method 100 is performed for some or all of the pixels in the grid lines of the image.

Method 100 employs a 1-D measurement of average gray scale along column or rows of pixels, depending on their proximity to vertical or horizontal gridlines. Areas where gridlines meet or cross may be corrected by measuring the average brightness in 2-D. In an instance, a box is used as the area 106. The box can be sized as the area of intersection between the vertical and horizontal lines. The box used at this intersection can be sized to not fall on other parts of the grid line 105 outside of the intersection.

Figure 4:
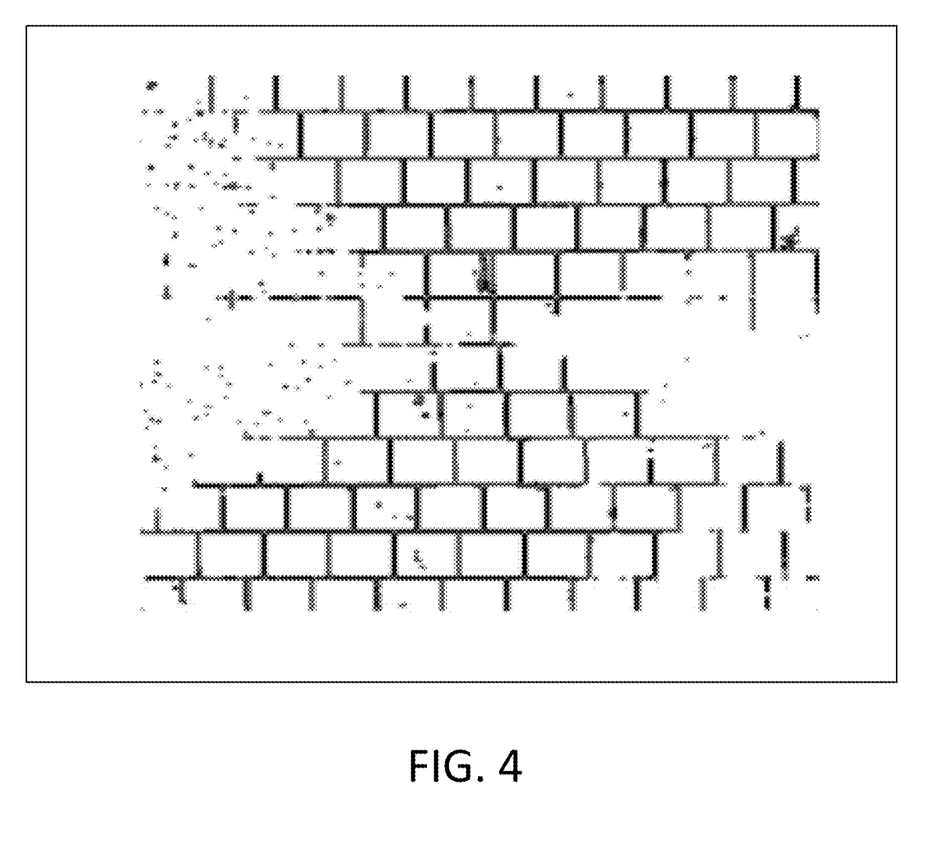
FIG. 4 is an exemplary image depicting a defect map before using the method of FIG. 3.
Figure 5:
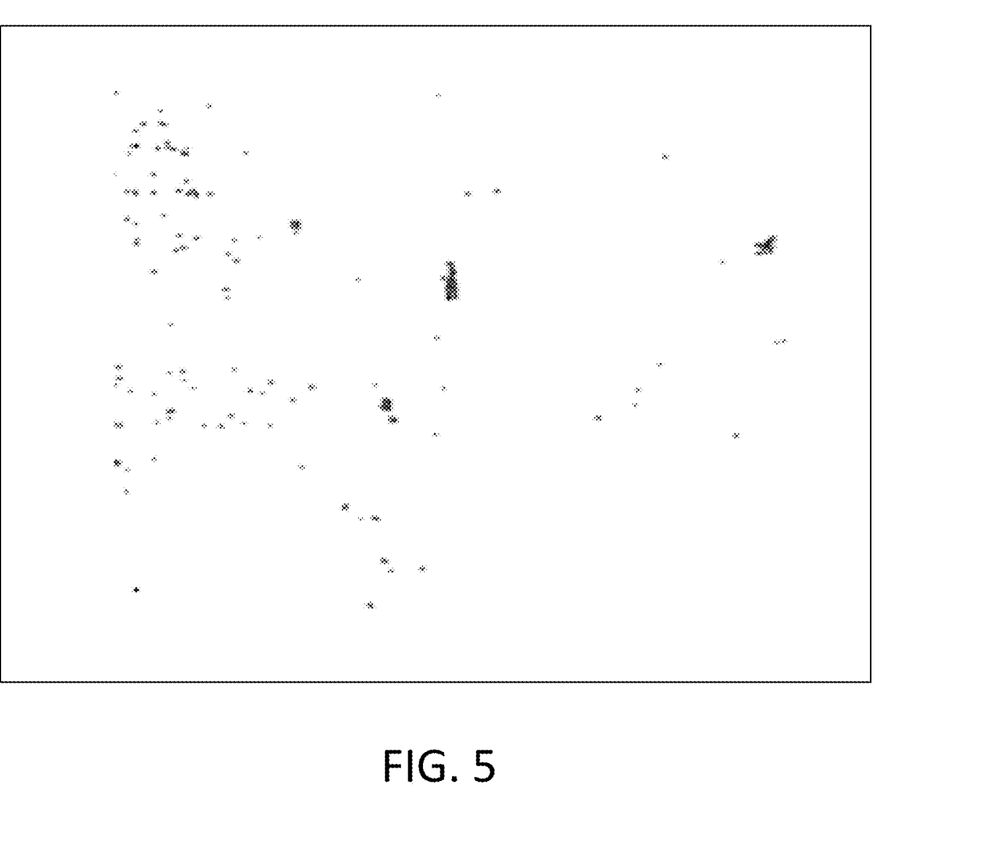
FIG. 5 is an exemplary image depicting the defect mater after using the method of FIG. 3.

FIGS. 4 and 5 show exemplary defect maps. The defect map in FIG. 4 includes both defects and grid lines. This can affect inspection or defect review. The grid lines can hide defects or can be a false positive. FIG. 5 shows a defect map of the same area after applying the method 100. The grid lines are suppressed, which allows real defects to identified and classified. Defect analysis of FIG. 5 will result in fewer errors than defect analysis of FIG. 4.

Figure 6:
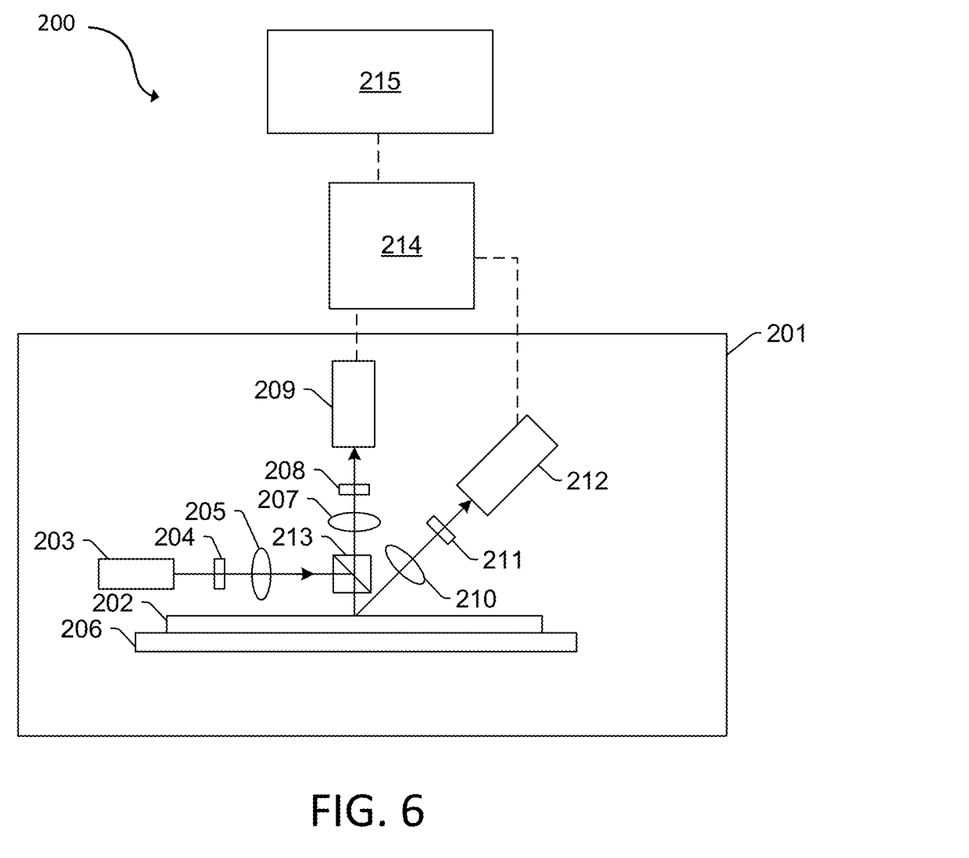
FIG. 6 is an embodiment of a system in accordance with the present disclosure.

One embodiment of a system 200 is shown in FIG. 6. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art, such as a laser-annealed wafer. Other specimens are possible.

In the embodiment of the system 200 shown in FIG. 6, optical based subsystem 201 includes an illumination subsystem configured to direct light to specimen 202. The illumination subsystem includes at least one light source. For example, as shown in FIG. 6, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 6, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 6. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 6 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 6) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broadband plasma (BBP) source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 6 as a single refractive optical element, it is to be understood that, in practice, lens 205 may include a number of refractive and/or reflective optical elements that in combination focus the light from the optical element to the specimen. The illumination subsystem shown in FIG. 6 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 6 includes two detection channels, one formed by collector 207, element 208, and detector 209 and another formed by collector 210, element 211, and detector 212. As shown in FIG. 6, the two detection channels are configured to collect and detect light at different angles of collection. In some instances, both detection channels are configured to detect scattered light, and the detection channels are configured to detect light that is scattered at different angles from the specimen 202. However, one or more of the detection channels may be configured to detect another type of light from the specimen 202 (e.g., reflected light).

As further shown in FIG. 6, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 6 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 6 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 6 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 6 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with a scanning electron microscope.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 is configured to generate an image of the specimen 202 (e.g., a laser-annealed semiconductor wafer) using data from the detector 209 and/or 212; determine a location of grid lines in the image; and fill an area covered by the grid lines by using a new gray value based on a second gray scale value of a neighborhood around the area. The neighborhood is outside of the area covered by the grid lines. This can be accomplished using any of the embodiments disclosed herein.

An additional embodiment relates to a non-transitory computer-readable medium storing program instructions executable on a controller for performing a computer-implemented method for adjusting the gray value on gridlines of a laser-annealed semiconductor wafer, as disclosed herein. In particular, as shown in FIG. 6, electronic data storage unit 215 or other storage medium may contain non-transitory computer-readable medium that includes program instructions executable on the processor 214. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

Illumination using the system 200 can be on a frontside or a backside of the specimen 202.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
    a light source that generates light;
    a stage configured to hold a laser-annealed semiconductor wafer in a path of the light;
    a detector configured to receive the light reflected from the laser-annealed semiconductor wafer; and
    a processor in electronic communication with the detector, wherein the processor is configured to:
        generate an image of the laser-annealed semiconductor wafer using data from the detector;
        determine a location of grid lines in the image;
        compare a first gray scale value of an area in the image covered by the grid lines to a second gray scale value of the neighborhood around the area, wherein the neighborhood is outside of the area covered by the grid lines;
        divide the first gray scale value in the area by a correction ratio to determine a new gray value, wherein the correction ratio is an average gray level in the area divided by an average gray level in the neighborhood; and
        fill the area in the image covered by the grid lines using the new gray value.

2. The system of claim 1, wherein the second gray scale value is taken from a position farther than a width of the grid line from the first gray scale value.

3. The system of claim 1, wherein the comparing, the dividing, and the filling are repeated for all pixels in the grid lines of the image.

4. The system of claim 1, wherein the light source and the detector are configured such that the image is a bright field image.

5. The system of claim 1, wherein the light source and the detector are configured such that the image is a dark field image.

6. The system of claim 1, wherein the processor is further configured to perform defect inspection on the image after the area is filled with the new gray value.

7. The system of claim 1, wherein the determining uses Sobel edge detection.

8. The system of claim 1, wherein the filling includes histogram remapping.

9. A method comprising:
    generating light using a light source;
    holding a laser-annealed semiconductor wafer in a path of the light;
    receiving the light reflected from the laser-annealed semiconductor wafer using a detector;
    determining, using a processor, a location of grid lines in an image of the laser-annealed semiconductor wafer, wherein the image uses data from the detector;
    comparing, using the processor, a first gray scale value of an area covered by the grid lines to a second gray scale value of the neighborhood around the area, wherein the neighborhood is outside of the area covered by the grid lines;
    dividing, using the processor, the first gray scale value in the area by a correction ratio to determine a new gray value, wherein the correction ratio is an average gray level in the area divided by an average gray level in the neighborhood; and
    filling, using the processor, the area in the image covered by the grid lines using the new gray value.

10. The method of claim 9, wherein the second gray scale value is taken from a position farther than a width of the grid line from the first gray scale value.

11. The method of claim 9, wherein the comparing, the dividing, and the filling are repeated for all pixels in the grid lines of the image.

12. The method of claim 9, wherein the image is a bright field image.

13. The method of claim 9, wherein the image is a dark field image.

14. The method of claim 9, further comprising performing defect inspection on the image after the filling.

15. The method of claim 9, wherein the determining uses Sobel edge detection.

16. The method of claim 9, wherein the filling includes histogram remapping.

* * * * *